United States Patent [19]
Houston

[11] Patent Number: 5,310,694
[45] Date of Patent: May 10, 1994

[54] METHOD FOR FORMING A TRANSISTOR DEVICE WITH RESISTIVE COUPLING

[75] Inventor: Theodore W. Houston, Richardson, Tex.

[73] Assignee: Texas Instruments Incorporated, Dallas, Tex.

[21] Appl. No.: 972,671

[22] Filed: Nov. 6, 1992

Related U.S. Application Data

[62] Division of Ser. No. 719,430, Jun. 24, 1991, Pat. No. 5,206,533.

[51] Int. Cl.$^5$ .................... H01L 21/70; H01L 27/00
[52] U.S. Cl. ........................ 437/52; 437/47; 437/60; 437/918
[58] Field of Search .............. 437/52, 48, 47, 60, 437/918

[56] References Cited

U.S. PATENT DOCUMENTS

| | | | |
|---|---|---|---|
| 4,232,327 | 11/1980 | Hsu | 357/23 |
| 4,367,580 | 1/1983 | Guterman | 437/918 |
| 4,724,530 | 2/1988 | Dingwall | 365/156 |
| 4,797,804 | 1/1989 | Rockett, Jr. | 365/154 |
| 5,145,799 | 9/1992 | Rodder | 437/52 |

FOREIGN PATENT DOCUMENTS

| | | | |
|---|---|---|---|
| 57-93573 | 6/1982 | Japan | 357/42 |
| 2-150062 | 6/1990 | Japan | 357/51 |

Primary Examiner—Olik Chaudhuri
Assistant Examiner—H. Jey Tsai
Attorney, Agent, or Firm—Ira S. Matsil; James C. Kesterson; Richard L. Donaldson

[57] ABSTRACT

A static memory cell comprises a first PMOS transistor including a drain 319, a channel 344, a source 317, and a lightly doped drain 360 and a first NMOS transistor including a source 323, a channel 346, and a drain 321. A first gate 334 insulatively overlies the channel 344 and the lightly doped drain region 360 of the first PMOS transistor as well as the channel 346 of the first NMOS transistor. The memory cell also includes a second PMOS transistor which in turn includes a source 327, a channel 362, a source 325, and a lightly doped drain 364 and a second NMOS transistor which includes a source 323, a channel 368, and a drain 329. A second gate 338 insulatively overlies the channel 362 and the lightly doped drain region 364 of the second PMOS transistor and the channel 368 of the second NMOS transistor. A first gated resistor is coupled between the drain 319 of the first PMOS transistor and the second gate 338 and a second gated resistor is coupled between the drain 327 of the second PMOS transistor and the first gate 334. Other systems and methods are also disclosed.

16 Claims, 4 Drawing Sheets

METHOD FOR FORMING A TRANSISTOR DEVICE WITH RESISTIVE COUPLING

This invention was made with government support under contract number DNA001-89-C-0136 awarded by the Defense Nuclear Agency of the Department of Defense. The Government may have certain rights in this invention.

This is a division of application Ser. No. 07/719,430, filed Jun. 24, 1991, now U.S. Pat. No. 5,206,533.

FIELD OF THE INVENTION

This invention generally relates to the fabrication of semiconductor devices and specifically to a transistor device with resistive coupling.

BACKGROUND OF THE INVENTION

A static memory is a device in which the stored data is retained at all times during which power is applied to the memory device. In a random-access memory (RAM), data words are stored in locations which may be independently accessed.

One method of storing data is to use two inverters connected such that the output of the first inverter is coupled to the input of the second inverter and the output of the second is coupled to the input of the first inverter. Here, if the output of the first inverter, and therefore the input of the second inverter, is a logical "1", the output of the second inverter is a logical "0". This node is also of the input of the first inverter and therefore maintains the output of the first inverter at a logical "1".

As computer systems become faster and more complex there is a continuing desire to have memory cells which are faster and smaller. If each individual cell is smaller, more cells may be formed on a given chip which in turn lowers systems costs and increases design flexibility. In addition, as cells get smaller the operation is faster.

Also, as dimensions are decreased, memory cells become increasingly sensitive to upset by energetic particles such as cosmic rays in space or alpha particles emitted from common packaging material. One approach to decrease the sensitivity of SRAM cells to upset is to add resistance to the cross-coupling of the two inverters. However, this approach can increase the size of the cell.

Accordingly, improvements in the overall size of static memory cells, particularly with improved resistance to upset, are presently desirable.

SUMMARY OF THE INVENTION

Other objects and advantages will be obvious, and will in part appear hereinafter and will be accomplished by the present invention which provides a method and apparatus for a transistor device with resistive coupling which may be used for as the basis for an improved layout for a static memory cell.

A semiconductor transistor device comprises heavily doped source region and drain regions of a first conductivity type as well as a lightly doped channel region formed adjacent to the source region. The lightly doped channel region is formed from a second conductivity type different than the first conductivity type. A lightly doped drain region of the first conductivity type and formed between the drain region and the channel region. The lightly doped drain includes an extended portion for making a resistive contact to another region.

In one embodiment, a static memory cell comprises a first PMOS transistor including a source, a channel, a drain, and a lightly doped drain and a first NMOS transistor including a source, a channel, and a drain. A first gate insulatively overlies the channel and the lightly doped drain region of the first PMOS transistor and the channel of the first NMOS transistor. The memory cell also includes a second PMOS transistor which in turn includes a source, a channel, a drain, and a lightly doped drain and a second NMOS transistor which includes a source, a channel, and a drain. A second gate insulatively overlies the channel and the lightly doped drain region of the second PMOS transistor and the channel of the second NMOS transistor. A first gated resistor is coupled between the drain of the first PMOS transistor and the second gate and a second gated resistor is coupled between the drain of the second PMOS transistor and the first gate.

An advantage of the invention is it provides a more compact layout than prior art cells and in turn more cells can be formed within the same surface area. This higher density is a great advantage since both lower cost and higher speeds may be achieved.

Another advantage of the invention is that it has increased single event upset resistance and resistance to soft errors. The layout has both a resistive cross coupling and a lightly doped drain region which provides increased capacitance between the cross coupling lines. The increased SEU resistance is an advantage over prior art devices since it increases the performance of the device.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be a ,preciated that the present invention provides many applicable inventive concepts which can be embodied in a wide variety of specific contexts. The specific embodiments discussed are merely illustrative of specific ways to make and use the invention, and do not delimit the scope of the invention.

Figure 1:
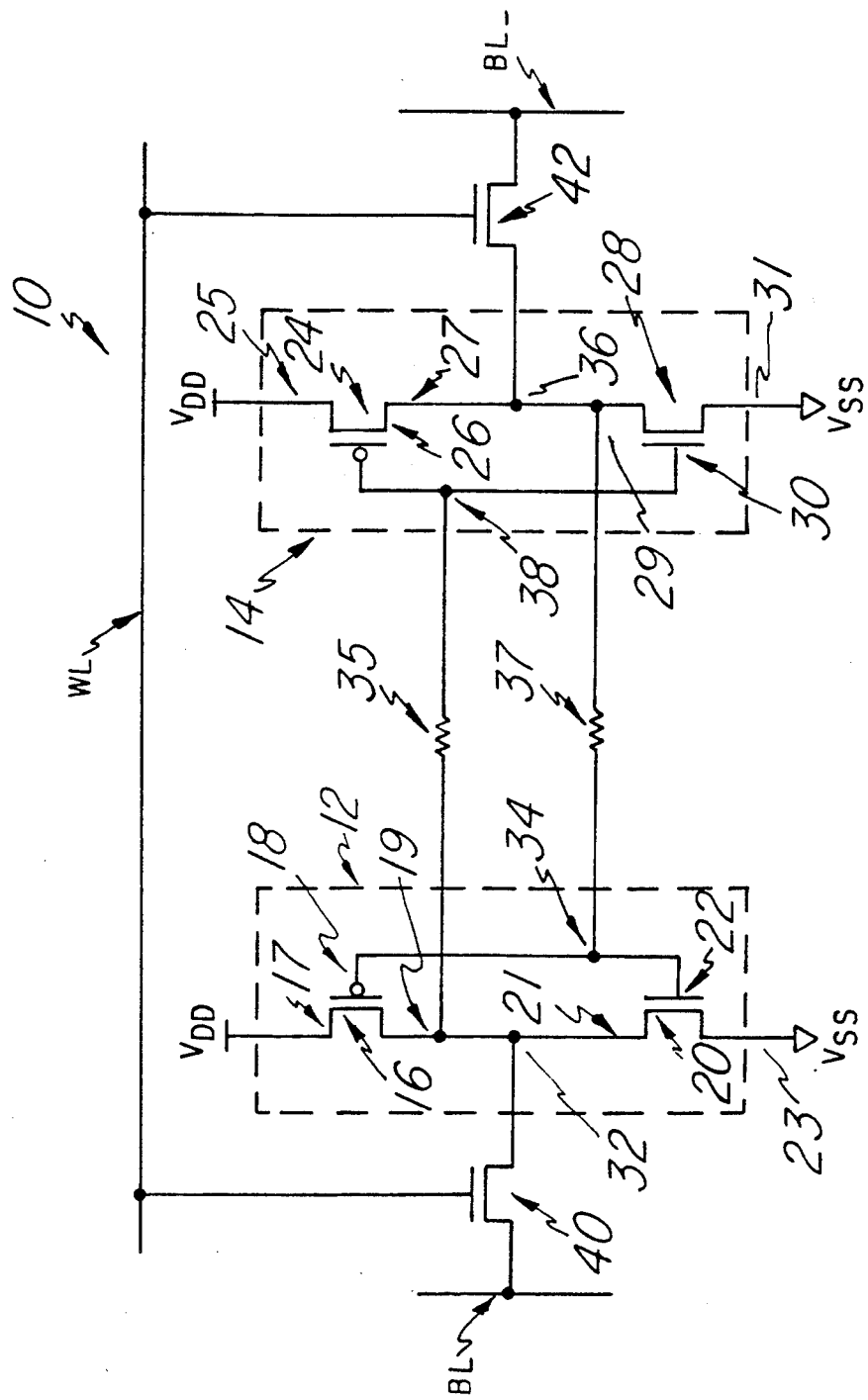
FIG. 1 is a circuit diagram of a static memory cell.

Referring first to FIG. 1, a static random access memory (SRAM) cell 10 is shown in circuit form. The SRAM cell 10 includes inverter 12 which is cross coupled with inverter 14. In the cells shown, inverter 12 includes PMOS (p-channel metal oxide semiconductor) transistor 16 and NMOS (n-channel metal oxide semiconductor) transistor 20. The source 17 of PMOS transistor 16 is connected to a first voltage level $V_{DD}$, typically five volts for example. The drain 19 of PMOS transistor 16 is connected to the drain 21 of NMOS transistor 20 at the output node 32. The gate 18 of PMOS transistor 16 is connected to the gate 22 of NMOS transistor 20 at the input node 34. The source 23 of NMOS transistor 20 is connected to a second voltage level $V_{SS}$, typically ground for example. Likewise inverter 14 includes PMOS transistor 24 and NMOS transistor 28. The source 25 of PMOS transistor 24 is also connected to a first voltage level $V_{DD}$. The drain 27 of PMOS transistor 24 is connected to the drain 29 of NMOS transistor 28 at the second inverter output node 36. The gate 26 of PMOS transistor 24 is connected to the gate 30 of NMOS transistor 28 at the second inverter input node 38. The source 31 of NMOS transistor 28 is connected to the second voltage level $V_{SS}$.

The memory cell 10 operates as a bi-stable logic device since the output 32 has a voltage level of either $V_{DD}$ or $V_{SS}$ volts. The second inverter output node 36 has the opposite voltage level of the output 32. As an example of steady state operation, if the node 32 is high (i.e., at voltage level $V_{DD}$), NMOS transistor 28 is rendered conductive while PMOS transistor 24 is rendered non-conductive. The node 36 will then be low (i.e., at voltage level $V_{SS}$). Since 36 is coupled to second inverter input 34, transistor 16 will be conductive and the transistor 20 will be non-conductive, maintaining node 32 at a high level.

Transistors 40 and 42 are provided for addressing the cell. When the wordline WL is high (e.g., at +5 volts) the transistors 40 and 42 will be conductive and the first inverter output node 32 will be coupled to bit line BL and the second inverter output node 36 will be coupled to bit line BL_. The memory cell may be written to or read from using well-known addressing techniques which for the sake of simplicity will not be discussed here.

In order to decrease the probability of single event upset (SEU) or a soft error, a resistor 35 may be included in the connection between first inverter output 32 and second inverter input 38. Likewise, a second resistor 37 may be included between second inverter output 36 and first inverter input 34. In prior art cells, the resistors 35 and 37 may be silicon or polysilicon resistors for example.

Figure 2:
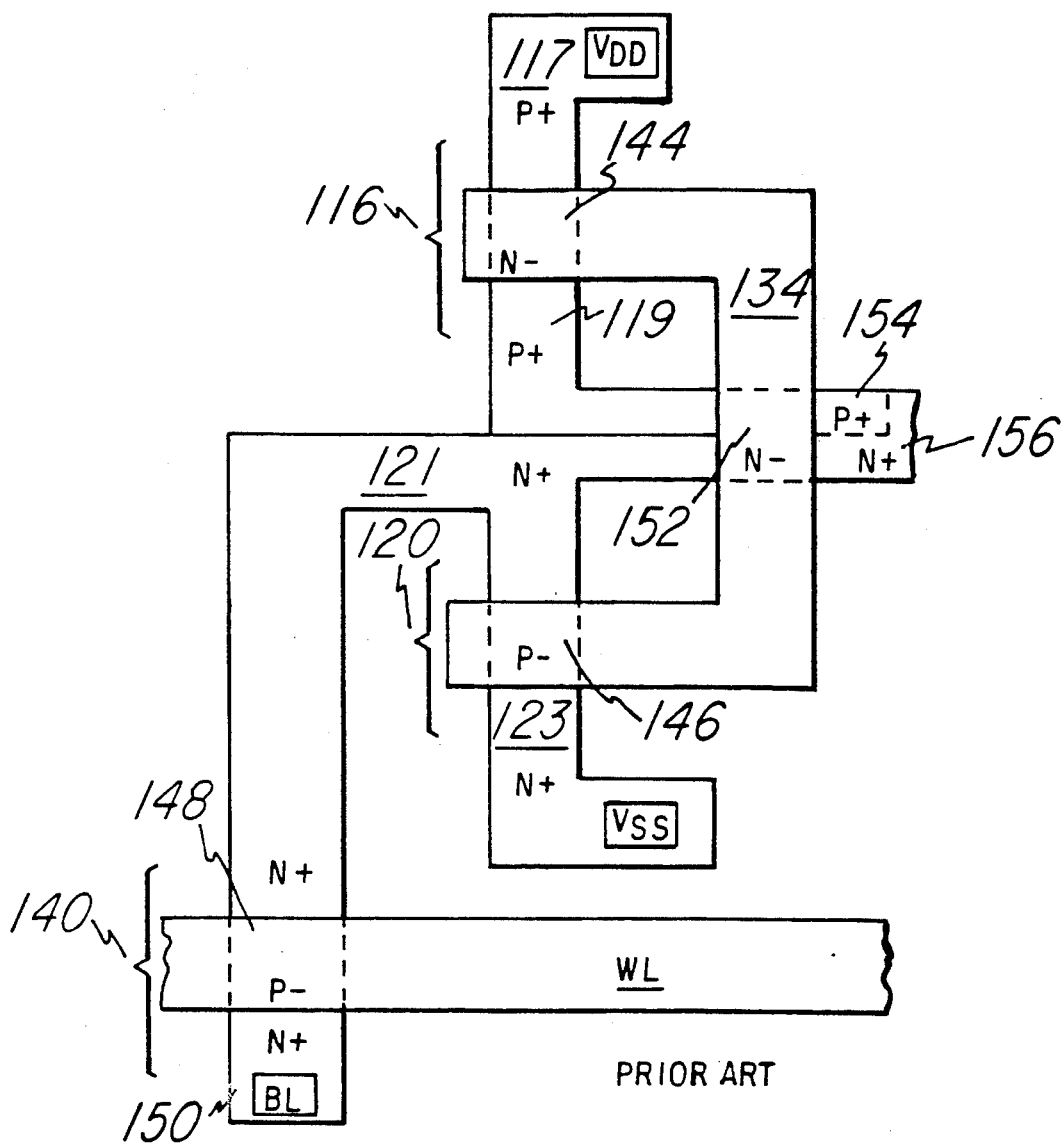
FIG. 2 is a prior art layout of a portion of a memory cell.

A conventional layout for an inverter with provision for a grated resistance in its output, implemented with silicon on insulator (SOI) technology, (such as inverter 12 or inverter 14 as described with respect to FIG. 1) is shown in FIG. 2. A p-channel transistor 116 is formed from regions 117, 144 and 119 and an n-channel transistor 120 is formed from doped regions 121, 146, and 123. These transistors share gate 134. The pass transistor 140 is formed from regions 121, 148 and 150 with the wordline WL serving as the gate. In addition, a transistor may be formed from P+ region 119, n− region 152, and P+ region 154 for the purpose of a resistive coupling of the inverter to another inverter, for example.

Figure 3:
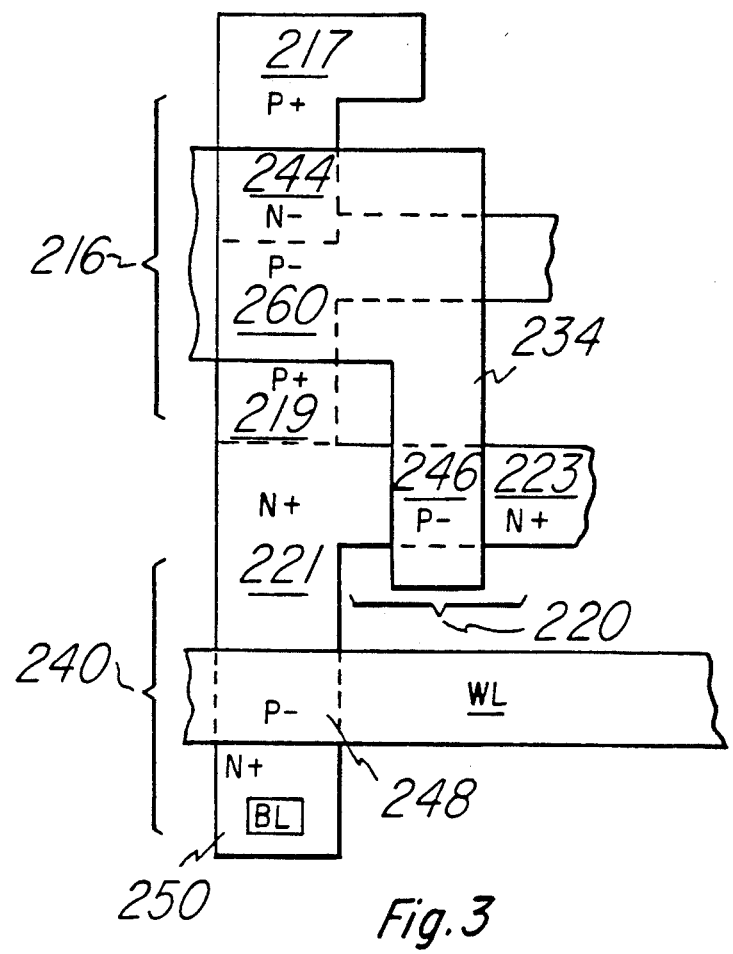
FIG. 3 is a layout of a portion of a memory cell built according to the present invention.

An improved, condensed layout for the inverter is shown in FIG. 3. A p-channel transistor is formed from p+ region 217 which serves as the source, n− region 244 which serves as the channel, and p+ region 219 which serves as the drain. Also included in the transistor is p− region 260 which serves as a lightly doped drain (LDD) portion. A gate 234, typically polysilicon, insulatively overlies the channel region 244 and the LDD portion 260 of the transistor 216.

An n-channel transistor 220 is formed from n+ region 221 which serves as the drain, p− region 246 which serves as the channel and n+ region 223 which serves as the source. The gate 234 also overlies channel region 246.

Also illustrated in FIG. 3 is an additional transistor 240 which may act as a pass transistor in a static memory cell. The transistor 240 is formed from n+ region 221, p− region 248 and n+ region 250. The word line WL acts as the gate for the transistor.

The layout illustrated in FIG. 3 has a clear advantage over the conventional layout shown in FIG. 2. The cell 210 has been compacted and therefore takes up less area than prior art layouts. Since the cell 210 is typically one cell in an array of like cells, more cells can provided in a given area. The increase in cell density is a major goal of circuit designers.

Figure 4:
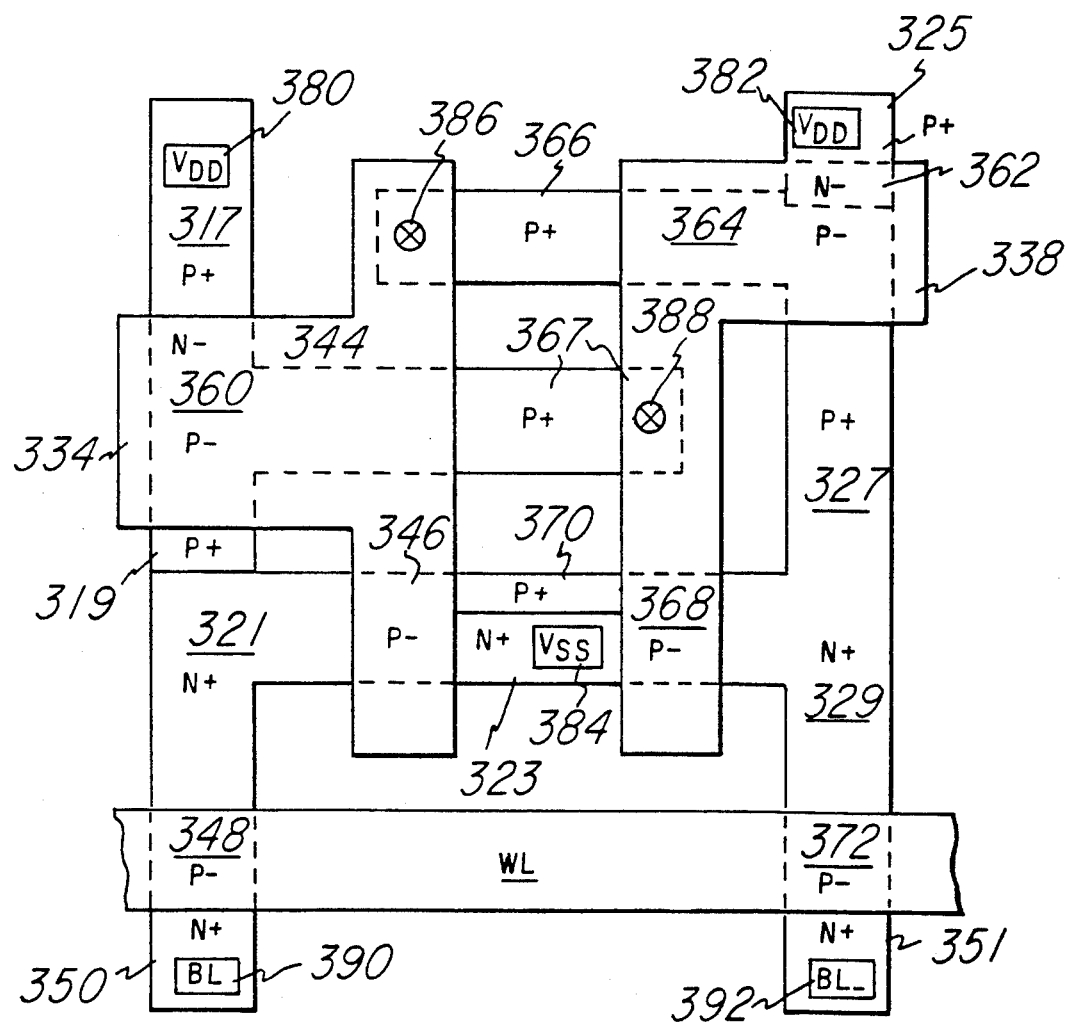
FIG. 4 is a layout of a memory cell built according to the present invention.

A static memory cell 210 is shown in FIG. 4 in layout form using inverters such as the one described in FIG. 3. Referring now to FIG. 4 along with FIG. 1, heavily doped p+ region 317 is coupled to voltage level $V_{DD}$ through contact 380. Methods for making contacts are well known in the art. P+ region 317 will serve as the source of p-channel transistor of the first inverter.

Adjacent to region 317 is n− region 344 which will serve as the channel of the p-channel transistor of the first inverter. Channel region 344 is formed beneath gate 334 and separated therefrom by an insulating layer, not shown, as is known in the art. Also formed beneath gate 334 is p− region 360 which serves as a lightly doped drain region for the p-channel transistor. P+ region 319 serves as the drain of the transistor.

The drain region 319 is resistively coupled to the gate 338 of the second inverter through the gated resistor which comprises p+ region 319, p− region 360, and p+ region 367. Local interconnect contact 388 is used to couple region 367 to the overlying gate region 338 utilizing known local interconnect methods. The gated resistor serves as the cross-coupling method between the two inverters.

Formed adjacent to the p-channel transistor is an n-channel transistor comprising n+ region 321 which serves as the drain, p− region 346 which serves as the channel, and n+ region 323 which serves as the source. The source 323 is coupled to power supply voltage $V_{SS}$, which may be ground for example. Also formed adjacent to n+ region 323 is p+ region 370 which is formed for the purpose of electrically connecting the body regions 346 and 368 to $V_{SS}$.

N+ region 321 is also adjacent to p− region 348 which serves as the channel region of the first pass transistor 40. The source of the pass transistor is n+ region 350 which is coupled to bit line BL through contact 390. Polysilicon wordline WL insulatively overlies channel region 348.

The second inverter comprises p+ region 325 is coupled to voltage level $V_{DD}$ through contact 382. P+ region 325 serves as the source of p-channel transistor of the second inverter.

Adjacent to p+ region 325 is n− region 362 which will serve as the channel of the p-channel transistor of the second inverter. Channel region 362 is formed beneath gate 338 and separated therefrom by an insulating layer, not shown, as is known in the art. Also formed beneath gate 338 is p− region 364 which serves as a lightly doped drain region for the p-channel transistor. P+ region 327 serves as the drain of the transistor.

The drain region 327 is resistively coupled to the first inverter gate 334 through the gated resistor which comprises p+ region 327, p− region 364, and p+ region 366. Local interconnect contact 386 is used to couple region 366 to the overlying gate region 334 utilizing known local interconnect methods. The gated resistor also serves as the cross-coupling method between the two inverters.

Formed adjacent to the p-channel transistor is an n-channel transistor comprising n+ region 329 which serves as the drain, p− region 368 which serves as the channel, and n+ region 323 which serves as the source. The source 323 is also the source of the n-channel transistor of the first inverter. Note that this method of connection varies from that shown in FIG. 1 but is, of course, functionally equivalent.

N+ region 329 is also adjacent to p− region 372 which serves as the channel region of the second pass transistor 42. The source of the pass transistor is n+ region 351 which is coupled to the complement bit line BL_through contact 392. Polysilicon wordline WL insulatively overlies channel region 372.

Although illustrated using CMOS technology, the inventive concepts may be utilized by changing the conductivity types of the doped regions as will be obvious to one skilled in the art.

The layout described in FIG. 4 provides substantially the same function as prior static memory cells but does so with significantly less area. As discussed previously, this advantage is very desirable.

The layout shown in FIG. 4 also provides an advantage of having both resistive (through the gated resistors) and capacitive (through the LDD regions 360 and 364) cross-coupling between the inverters. With both resistance and capacitance the SEU (single event upset) hardening is enhanced to an extent far greater than would be expected if using only the resistor or capacitor as described in co-pending patent application Ser. No. 719,900, incorporated herein by reference.

Although the inventive concept has been described with respect to an SRAM cell, other embodiments are possible. In general, any application which requires a resistive contact from one terminal of an insulated gate field effect transistor to another node (which can be of any device) will benefit from the invention described herein. As described above, a transistor with a lightly doped drain which is extended to another node will accomplish the goal. This concept will work in either bulk technology or silicon on insulator technology.

In addition, the structures described herein may be built with stacked transistors (not shown). In one example, the NMOS drive and access transistors (e.g., elements 20 and 40 in FIG. 1) may be formed in the bulk material and an insulating layer formed thereon. Polysilicon (polycrystalline or amorphous) may then be deposited on the insulating layer and recrystalized and the PMOS load transistor with resistive coupling (e.g., element 16 in FIG. 1) formed in the recrystalized silicon. The formation of stacked transistors is well known in the art and application of the inventive concept described herein will be obvious to those skilled in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a static memory cell comprising the steps of:
   forming a first PMOS transistor including a source, a channel, a drain, and a lightly doped drain;
   forming a first NMOS transistor including a source, a channel, and a drain;
   forming a first gate insulatively overlying said channel and said lightly doped drain region of said first PMOS transistor and said channel of said first NMOS transistor;
   forming a second PMOS transistor including a source, a channel, a drain, and a lightly doped drain;
   forming a second NMOS transistor including a source, a channel, and a drain;
   forming a second gate insulatively overlying said channel and said lightly doped drain region of said second PMOS transistor and said channel of said second NMOS transistor;
   forming a first gated resistor coupled between said drain of said first PMOS transistor and said second gate, wherein said first gated resistor comprises said drain of said first PMOS transistor, said lightly doped drain of said first PMOS transistor, and a more heavily p-type doped region which is coupled to said second gate; and
   forming a second gated resistor coupled between said drain of said second PMOS transistor and said first gate.

2. The method of claim 1 and further comprising the steps of:
   forming a first PMOS pass transistor coupled to the drain of said first NMOS transistor; and
   forming a second PMOS pass transistor coupled to the drain of said second NMOS transistor.

3. The method of claim 1 wherein said first and second NMOS transistors are formed such that they share a common source region.

4. The method of claim 3 and further comprising the step of coupling said common source region to a ground potential.

5. The method of claim 1 wherein said second gated resistor comprises said lightly doped drain of said second PMOS transistor and a heavily p-type doped region which is coupled to said first gate.

6. The method of claim 1 and further comprising the steps of providing a power supply voltage, said power supply voltage coupled to said source of said first PMOS transistor and said source of said second PMOS transistor.

7. The method of claim 1 wherein said steps of forming a static memory cell comprise the steps of forming an array of substantially like cells.

8. The method of claim 1 wherein said cell is formed in silicon on insulator technology.

9. The method of claim 1 wherein said step of forming a PMOS transistor comprises forming a stacked transistor.

10. The method of claim 9 wherein said PMOS transistor is formed in recrystallized polysilicon.

11. A method of forming a semiconductor transistor device comprising the steps of:
    forming a heavily doped source region and drain regions of a first conductivity type;

forming a lightly doped channel region formed adjacent to said source region, said lightly doped channel region of a second conductivity type different than said first conductivity type;

forming a lightly doped drain region of said first conductivity type, said lightly doped drain region formed between said drain region and said channel region and including an extended portion for making a resistive contact to another region; and forming a gated resistor between said drain region and said another region, wherein said gated resistor comprises said drain region, said lightly doped drain region, and a heavily doped region of said first conductivity type which is coupled to said another region.

12. The method of claim 11 wherein said first conductivity type comprises a p-type doped material.

13. The method of claim 12 and further comprising the steps of:
   coupling said drain region of said transistor to an NMOS transistor drain region; and
   coupling said lightly doped region to an inverter input.

14. The method of claim 13 wherein said inverter is a CMOS inverter.

15. The method of claim 11 wherein said transistor is formed on an insulating layer.

16. The method of claim 11 wherein said transistor is formed in recrystallized polysilicon.

* * * * *